United States Patent
Lee

(10) Patent No.: US 10,504,580 B2
(45) Date of Patent: Dec. 10, 2019

(54) SYSTEMS AND METHODS FOR REFRESHING A MEMORY BANK WHILE ACCESSING ANOTHER MEMORY BANK USING A SHARED ADDRESS PATH

(71) Applicant: MICRON TECHNOLOGY, INC., Boise, ID (US)

(72) Inventor: Joosang Lee, Frisco, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/692,804

(22) Filed: Aug. 31, 2017

(65) Prior Publication Data

US 2019/0066766 A1    Feb. 28, 2019

(51) Int. Cl.
| | |
|---|---|
| G11C 11/406 | (2006.01) |
| G11C 11/408 | (2006.01) |
| G11C 7/10 | (2006.01) |
| G11C 8/04 | (2006.01) |

(52) U.S. Cl.
CPC ...... *G11C 11/40618* (2013.01); *G11C 7/1042* (2013.01); *G11C 7/1066* (2013.01); *G11C 7/1072* (2013.01); *G11C 7/1093* (2013.01); *G11C 8/04* (2013.01); *G11C 11/408* (2013.01)

(58) Field of Classification Search
CPC ............ G11C 11/40618; G11C 7/1042; G11C 7/1072; G11C 7/1066; G11C 11/408; G11C 7/1093
See application file for complete search history.

(56) References Cited

U.S. PATENT DOCUMENTS

| | | | | |
|---|---|---|---|---|
| 5,999,472 | A * | 12/1999 | Sakurai | G11C 11/40618 365/222 |
| 6,859,407 | B1 | 2/2005 | Suh | |
| 7,043,599 | B1 * | 5/2006 | Ware | G11C 11/406 711/106 |
| 2005/0265102 | A1 | 12/2005 | Remaklus, Jr. et al. | |
| 2007/0033339 | A1 * | 2/2007 | Best | G11C 11/406 711/106 |
| 2007/0086266 | A1 | 4/2007 | Freebern et al. | |
| 2012/0300568 | A1 * | 11/2012 | Park | G11C 11/40618 365/222 |
| 2013/0254475 | A1 * | 9/2013 | Perego | G11C 11/40603 711/106 |

(Continued)

FOREIGN PATENT DOCUMENTS

KR    20170057704 A    5/2017

OTHER PUBLICATIONS

U.S Appl. No. 15/676,424, filed Aug. 8, 2014, Joosang Lee.
PCT International Search Report & Written Opinion for PCT Application No. PCT/US2018/028895 dated Aug. 7, 2018; 12 Pages.

*Primary Examiner* — Jerome Leboeuf
(74) *Attorney, Agent, or Firm* — Fletcher Yoder, P.C.

(57) ABSTRACT

A system includes first and second sets of memory banks that store data. The system also includes an address path coupled to the memory banks that provides a row address to the memory banks. The system further includes a command address input circuit coupled to the address path. The command address input circuit includes a counter that stores and increments the row address. The system also includes a flip-flop that stores the row address in response to receiving a command to refresh the first set of memory banks.

16 Claims, 7 Drawing Sheets

(56) References Cited

U.S. PATENT DOCUMENTS

| | | | |
|---|---|---|---|
| 2015/0043293 A1* | 2/2015 | Song | G11C 11/40618 365/222 |
| 2016/0027492 A1* | 1/2016 | Byun | G11C 11/406 365/222 |
| 2016/0203853 A1 | 7/2016 | Park et al. | |

* cited by examiner

SYSTEMS AND METHODS FOR REFRESHING A MEMORY BANK WHILE ACCESSING ANOTHER MEMORY BANK USING A SHARED ADDRESS PATH

BACKGROUND

Field of the Present Disclosure

Embodiments of the present disclosure relate generally to the field of semiconductor devices. More specifically, embodiments of the present disclosure relate to refreshing a first memory bank of the semiconductor device while accessing a second memory bank of the semiconductor device using a shared address path.

Description of Related Art

A semiconductor memory device, such as a dynamic random-access memory (DRAM), may refresh a memory cell by periodically reading information from the memory cell and rewriting the read information to the memory cell to preserve the information. For example, each bit of memory data in the memory may be stored as a presence or absence of an electric charge on a capacitor on the memory. As time passes, the electric charge may leak and eventually be lost, unless the data is refreshed. As such, external circuitry may periodically read each memory cell and rewrite the data to the memory cell, restoring the charge on the capacitor to its original level. A memory refresh cycle may refresh a group or area (such as a bank) of memory cells at one time, and each successive cycle may refresh a next group or area of memory cells, thus refreshing all memory cells in the memory. This refresh process may be conducted by a controller of the memory device and/or by a user periodically to keep data in the memory cells.

A memory may include multiple memory banks of memory cells. If a memory bank is being refreshed, then that memory bank may not be accessed (e.g., for read and/or write operations). Some DRAMs, such as a DDR5 SDRAM (double data rate type five synchronous dynamic random access memory), may be capable of refreshing only some memory banks, while enabling access to other memory banks.

Refreshing or accessing a memory bank may be performed by providing a row address on a single address path to the memory circuitry to be refreshed or accessed. The row address to be refreshed may be stored and maintained in a counter (e.g., in the memory) that may be incremented after each time the row address is transmitted to the register. The row address to be accessed may be provided via an external device (e.g., an external controller), along with, for example, an activate command. In either case, the row address may be transmitted and stored in a register of the memory, and the command address input circuit or command decoder may transmit a command to refresh or access the memory bank. Bank control blocks coupled to the memory banks may then perform a refresh or access operation based on the row address stored in the register.

However, the command address input circuit or command decoder may transmit a command that performs multiple refresh operations on one or more rows of a first memory bank (including the row address stored in the register). In some embodiments, a single command (e.g., issued externally from the first memory bank) may perform multiple refresh operations on multiple rows of the first memory bank consecutively. Each refresh operation may be performed within a given refresh time ($t_{RFC}$). One of these multiple refresh operations may be performed at or near approximately the same time as when an activate operation (e.g., to read from or write to a row) is performed on a second memory bank by storing an activate row address in the register (thus possibly overwriting the row address stored in the register for the refresh operation). As such, either the refresh operation may be performed on the wrong row address (i.e., the row address of the second memory bank to be activated) or the activate operation may be performed on the wrong row address (i.e., the row address of the first memory bank to be refreshed).

Embodiments of the present disclosure may be directed to one or more of the problems set forth above.

DETAILED DESCRIPTION

Figure 1:
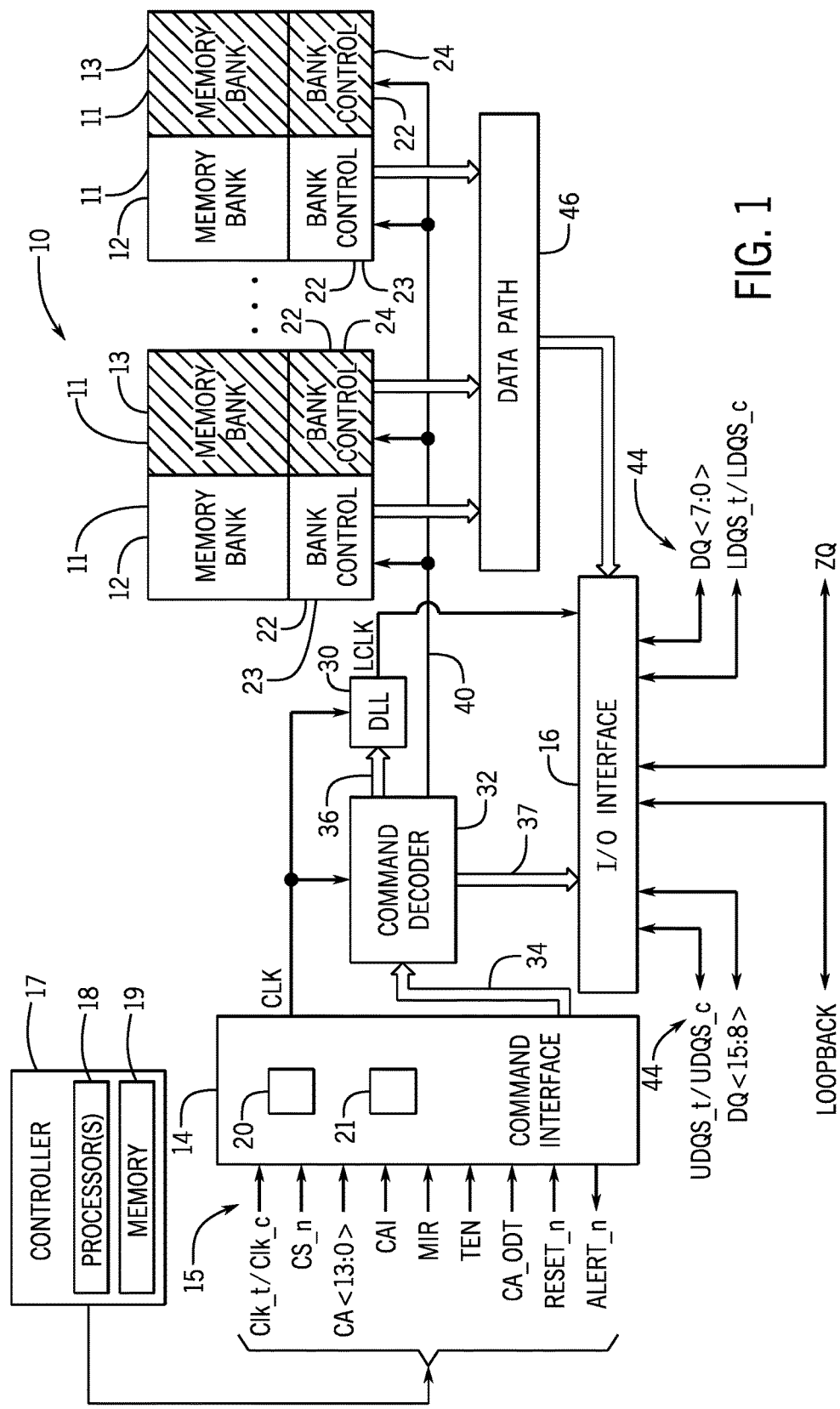
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As described in detail below, assuming memory banks of a memory device are synchronized (such that the row addresses of the most recently refreshed row of each memory bank are the same), when a command performs multiple refresh operations on one or more rows of a first set of memory banks (and not on a second set of memory banks), a first set of bank control blocks may capture a row address stored in a register, refresh a first set of rows of the first set of memory banks corresponding to the row address that was captured from the register, increment the captured row address (as opposed to capturing a subsequent row address stored in the register), and refresh a second set of rows of the first set of memory banks corresponding to the row address that was captured from the register and incremented. During refresh of the first and second set of rows of the first set of memory banks, a second set of bank control blocks may activate the second set of memory banks. Moreover, in response to receiving the command, a flip-flop (or any other suitable latching or gating logic) may store the row address. A second set of bank control blocks may refresh a first set of rows of the second set of memory banks corresponding to the row address stored in the flip-flop, internally increment the stored row address, and refresh a second set of rows of the second set of memory banks corresponding to the stored and internally incremented row address. In this manner, the memory device may refresh a first set of memory banks while activating a row of a second set of memory banks to access (e.g., read data from or write data to) the row of the second set of memory banks, while preventing a wrong row of the first set of memory banks from being refreshed or a wrong row of the second memory banks from being activated (and vice versa).

Additionally, a row address output circuit in a memory device may receive a first command. When the first command refreshes all memory banks of the memory device (e.g., a $REF_{ab}$ command), the row address output circuit may select or output a counter output (e.g., a row address of the memory banks to be refreshed). The counter may then be incremented (e.g., to a next row address of the memory banks to be refreshed). When the first command activates a row of the memory banks (e.g., an ACT command), the row address output circuit selects or outputs a row address (e.g., to be read or written to). When the first command refreshes a first set of memory banks (e.g., a $REF_{sb}$ (Even) command), the row address output circuit may store the counter output in a flip-flop and select or output the counter output. The counter may then be incremented.

If the first command refreshes the first set of memory banks, the row address output circuit may then receive a subsequent command. When the subsequent command refreshes a second set of memory banks (e.g., a $REF_{sb}$ (Odd) command), the row address output circuit may select or output a flip-flop output. When the subsequent command refreshes the first set of memory banks (e.g., a $REF_{sb}$ (Even) command) again or all memory banks of the memory device (e.g., a $REF_{ab}$ command), the row address output circuit may select or output the flip-flop output, and receive an additional subsequent command. When the subsequent command is received the row address output circuit may select or output a flip-flop output, and receive an additional subsequent command. In this manner, synchronization or pairing of the rows in the memory banks being refreshed may be enforced or maintained.

Turning now to the figures, FIG. 1 is a simplified block diagram illustrating certain features of a semiconductor device (e.g., a memory device 10), according to an embodiment of the present disclosure. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM. While the present disclosure uses the memory device 10 as an example, it should be understood that embodiments of the present disclosure are envisioned to apply to any suitable semiconductor device, such as integrated circuits, transistors, processors, microprocessors, and the like.

The memory device 10, may include a number of memory banks 11. The memory banks 11 may be DDR5 SDRAM memory banks, for instance. The memory banks 11 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 11. The memory device 10 represents a portion of a single memory chip (e.g., SDRAM chip) having a number of memory banks 11. For DDR5, the memory banks 11 may be further arranged to form bank groups. For instance, for an 8 gigabit (Gb) DDR5 SDRAM, the memory chip may include 16 memory banks 11, arranged into 8 bank groups, each bank group including 2 memory banks. For a 16 Gb DDR5 SDRAM, the memory chip may include 32 memory banks 11, arranged into 8 bank groups, each bank group including 4 memory banks, for instance. Various other configurations, organization and sizes of the memory banks 11 on the memory device 10 may be utilized depending on the application and design of the overall system. For example, the memory banks 11 may be divided into sets of memory banks 11, such as even memory banks 12 and odd memory banks 13. It should be understood that references in the present disclosure to the even memory banks 12 should apply equally to the odd memory banks 13, and vice versa.

The memory device 10 may include a command interface 14 and an input/output (I/O) interface 16. The command interface 14 may include processing and/or interface circuitry configured to provide a number of signals (e.g., signals 15) from an external device, such as a controller 17. The controller 17 may include processing circuitry, such as one or more processors 18 (e.g., one or more microprocessors), that may execute software programs to, for example, provide various signals 15 to the memory device 10 to facilitate the transmission and receipt of data to be written to or read from the memory device 10. Moreover, the processor(s) 18 may include multiple microprocessors, one or more "general-purpose" microprocessors, one or more special-purpose microprocessors, and/or one or more application specific integrated circuits (ASICS), or some combination thereof. For example, the processor(s) 18 may include one or more reduced instruction set (RISC) processors. The controller 17 may couple to one or more memories 19 that may store information such as control logic and/or software, look up tables, configuration data, etc. In some embodiments, the processor(s) 18 and/or the memory 19 may be external to the controller 17. The memory 19 may include a tangible, non-transitory, machine-readable-medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof). The memory 19 may store a variety of information and may be used for various purposes. For example, the memory 19 may store machine-readable and/or processor-executable instructions (e.g., firmware or software) for the processor(s) 18 to execute, such as instructions for providing various signals 15 to the memory device 10 to facilitate the transmission and receipt of data to be written to or read from the memory device 10. As such, the controller 17 may provide various signals 15 to the memory device 10 to facilitate the transmission and receipt of data to be written to or read from the memory device 10.

As will be appreciated, the command interface 14 may include a number of circuits, such as a clock input circuit 20 and a command address input circuit 21, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The I/O interface 16 may include processing and/or interface circuitry configured to manage and/or perform input/output operations between the memory device 10 and any suitable external device coupled to the I/O interface 16.

The clock input circuit 20 receives the true clock signal (Clk_t/) and the complementary clock signal (Clk_c) and generates an internal clock signal CLK. The internal clock signal CLK is supplied to an internal clock generator, such as a delay locked loop (DLL) circuit 30. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The command decoder 32 may also provide command signals to the I/O interface 16 over bus 37 to facilitate receiving and transmitting I/O signals. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 11 corresponding to the command, via a bus path 40. As will be appreciated, the memory device 10 may include various other decoders, such as row decoders and column decoders, to facilitate access to the memory banks 11. In one embodiment, each memory bank 11 includes a bank control block 22 which provides the necessary decoding (e.g., row decoder and column decoder), as well as other features, such as timing control and data control, to facilitate the execution of commands to and from the memory banks 11. In particular, the bus path 40 may include a row address path that may provide a row address (e.g., sent from the command decoder 32 or one or more counters coupled to the row address path) to the bank control blocks 22 so that the bank control blocks 22 may perform operations on a row corresponding to the row address. The path 40 may be shared by both the command decoder 32 sending a row address on the path 40 to be activated, as well as the counters sending a row address on the path 40 to be refreshed. Similar to the memory banks 11, the bank control blocks 22 may also be divided into sets of bank control blocks 22, such as even bank control blocks 23 associated with the even memory banks 12 and odd bank control blocks 24 associated with the odd memory banks 13. It should be understood that references in the present disclosure to the even bank control blocks 23 should apply equally to the odd bank control blocks 24, and vice versa.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_c). The command interface may include a command address input circuit 21 which is configured to receive and transmit the commands to provide access to the memory banks 11, through the command decoder 32, for instance. In addition, the command interface 14 may receive a chip select signal (CS_n). The CS_n signal enables the memory device 10 to process commands on the incoming CA<13:0> bus. Access to specific banks 11 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 11 over the data path 46, which may include multiple data paths or bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance.

An impedance (ZQ) calibration signal may also be provided to the memory device 10 through the JO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
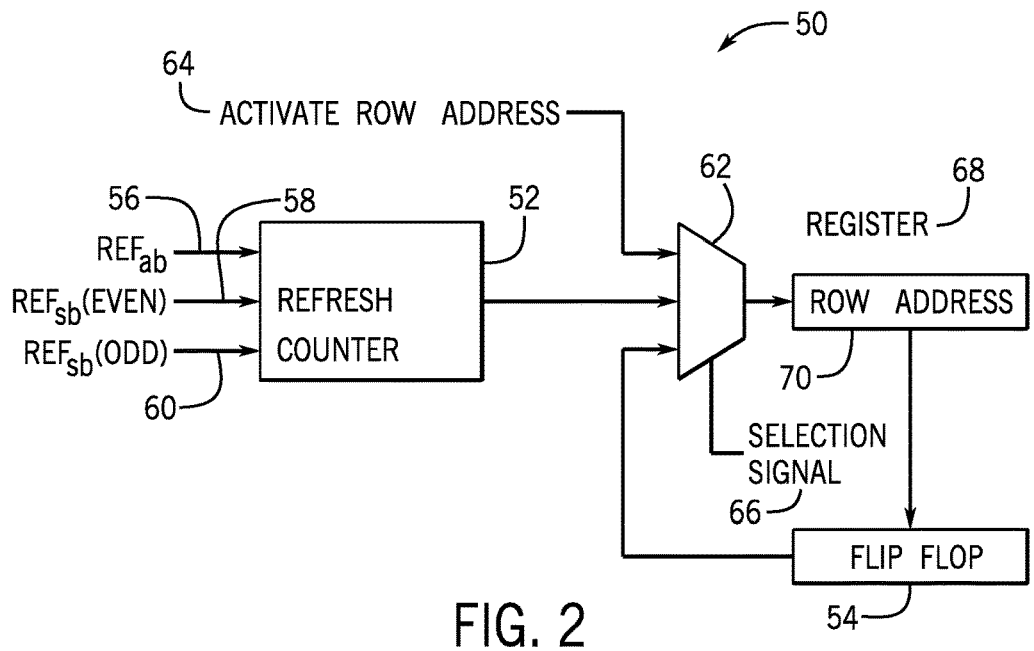
FIG. 2 is a schematic diagram of a row address output circuit of a command address input circuit of the memory device of FIG. 1, according to an embodiment of the present disclosure.

With the foregoing in mind, FIG. 2 is a schematic diagram of a row address output circuit 50 of the command address input circuit 21 of the memory device 10 of FIG. 1, according to an embodiment of the present disclosure. As illustrated, the row address output circuit 50 includes a refresh counter 52 and a flip-flop 54. The counter 52 may store a row address associated with a row of memory banks 11 of the memory device 10 to be refreshed. The counter 52 may increment the stored row address when the row address output circuit 50 receives, for example, a $REF_{ab}$ (refresh all memory banks) command 56, a $REF_{sb}$(Even) (refresh some memory banks—even) command 58, or a $REF_{sb}$(Odd) (refresh some memory banks—odd) command 60. The $REF_{ab}$ command 56 may be transmitted (e.g., by the command interface 14, the external controller 17, or the like) to refresh all memory banks 11, while the $REF_{sb}$ commands 58, 60 may be transmitted to each even bank control block 23 of the memory device 10 to refresh the even memory banks 12 (e.g., separately from the odd memory banks 13) or to each odd bank control block 24 of the memory device 10 to refresh the odd memory banks 13 (e.g., separately from the even memory banks 12), respectively.

That is, in response to receiving the $REF_{ab}$ command 56, each bank control block 22 may refresh the row address identified by the counter 52 of a respective memory bank 11. In response to receiving the $REF_{sb}$(Even) command 58, each even bank control block 23 may refresh the row address identified by the counter 52 of a respective even memory bank 12 (e.g., corresponding to the even bank control block 23). Similarly, in response to receiving the $REF_{sb}$(Odd) command 60, each odd bank control block 24 may refresh the row address identified by the counter 52 of a respective odd memory bank 13 (e.g., corresponding to the odd bank control block 24).

A multiplexer 62 of the row address output circuit 50 may accept as inputs the row address stored in the counter 52, a row address stored in the flip-flop 54, and an activate row address 64 (e.g., associated with a read or write operation). The multiplexer 62 may output one of these inputs based on a selection signal 66. The selection signal 66 may indicate whether the command sent to the row address output circuit 50 is, for example, the $REF_{ab}$ command 56, the $REF_{sb}$(Even) command 58, the $REF_{sb}$(Odd) command 60, an activate command, or the like. The multiplexer 62 may then output the row address stored in the counter 52, the row address stored in the flip-flop 54, or the activate row address 64, to a register 68 that stores the output as row address 70. The row address 70 may then be captured (e.g., by bank control blocks 22) to perform refresh and/or access (e.g., read/write) operations in the even memory banks 12, the odd memory banks 13, or both.

The flip-flop 54 may store the row address output by the multiplexer 62. It should be understood that the flip-flop 54 may be implemented as any suitable latching device, gating device, memory device, storage device, and the like, that may store at least a row address.

The bank control blocks 22 may perform any suitable number of refresh operations on any suitable number of rows of respective memory banks 11 (e.g., corresponding to the bank control blocks 22) per refresh command. For example, if the memory device 10 is operating in an FGR (Fine Granularity Refresh) 2× mode, a single refresh command may refresh one or more rows of a memory bank 11. If the memory device is operating in an FGR 1× mode, a single refresh command may perform two refresh operations on two sets of rows of a memory bank 11. As explained below, when a single refresh command performs more than one (e.g., two) refresh operations, one of the refresh operations may be performed at approximately the same time as an activate command, resulting in the refresh operation being performed on the wrong row address or the activate command being performed on the wrong row address.

Figure 3:
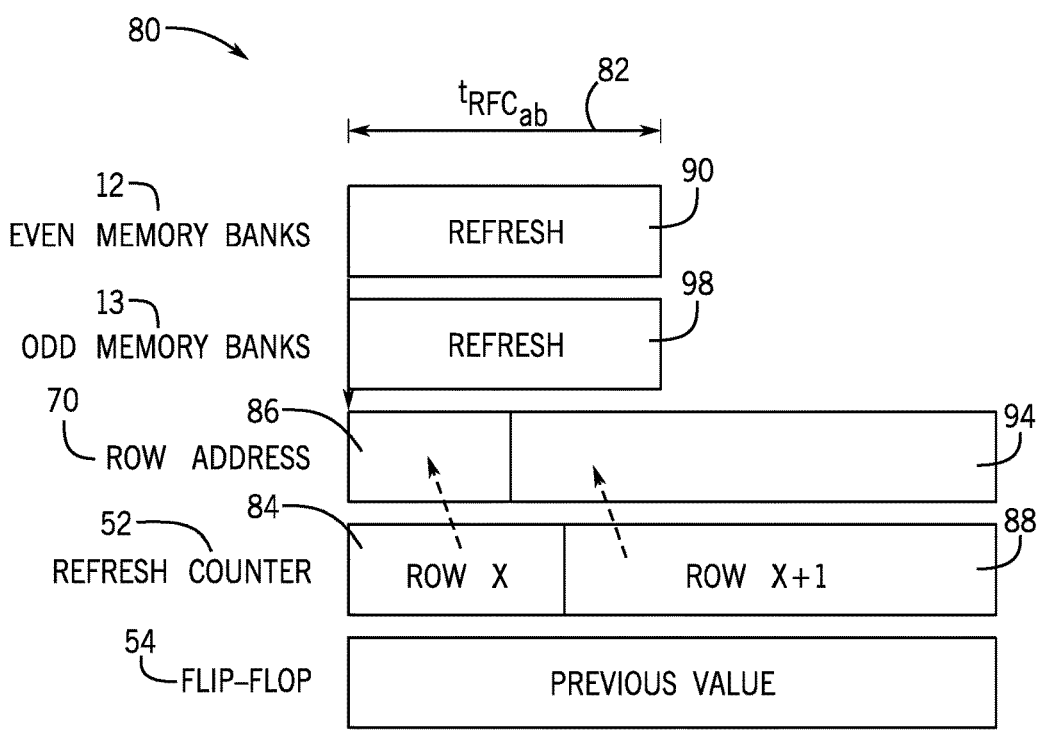
FIG. 3 is an example timing diagram illustrating bank control blocks performing a command that performs one refresh operation on one or more rows of all memory banks of the memory device of FIG. 1 using a shared address path, according to an embodiment of the present disclosure.

FIG. 3 is an example timing diagram 80 illustrating the bank control blocks 22 performing the $REF_{ab}$ command 56 that performs one refresh operation on one or more rows of all memory banks 11 of the memory device 10 of FIG. 1 using a shared address path 40, according to an embodiment of the present disclosure. In particular, the memory device 10 may be operating in the FGR 2× mode. Each refresh operation performed by the $REF_{ab}$ command 56 may take $t_{RFCab}$ ns (nanoseconds) 82. For example, in the case of the memory device 10 operating in the FGR 2× mode, $t_{RFCab}$ 82 may be approximately on the order of 100 ns. In response to receiving the $REF_{ab}$ command 56 (e.g., at the command decoder 32), the even bank control blocks 23 may refresh the even memory banks 12 while (e.g., simultaneously) the odd bank control blocks 24 refresh the odd memory banks 13. Because the even memory banks 12 and the odd memory banks 13 are being refreshed during the $REF_{ab}$ command 56, no memory banks 11 of the memory device 10 may be activated (e.g., for read/write operations).

For example, in response to receiving the $REF_{ab}$ command 56, the row address output circuit 50 may output the row address (i.e., Row X 84) in the counter 52 on the shared address path 40 to store in the register 68 as the row address 70 (i.e., as shown in portion 86) to perform a refresh operation. The refresh counter 52 may then increment the stored row address (i.e., from Row X 84 to Row X+1 88) to account for Row X 84 of the even memory banks 12 and the odd memory banks 13 being refreshed. The even bank control blocks 23 and the odd bank control blocks 24 may capture the row address 70 (i.e., Row X 84) and refresh 90, 98 the row address 70 in the even memory banks 12 and the odd memory banks 13.

Because the flip-flop 54 may store a row address in response to a first (e.g., after the memory banks 11 are synchronized) $REF_{sb}$ command 58, 60 that performs a refresh operation on one or more rows of a set (e.g., even or odd) of memory banks 11, the flip-flop 54 may not update its value based on the $REF_{ab}$ command 56. As such, the flip-flop 54 may store a previous value (stored during a previous first $REF_{sb}$ command 58, 60) or no value.

While the example described in the timing diagram 80 of FIG. 3 illustrates one row (e.g., Row X 84) of the even memory banks 12 and the odd memory banks 13 being refreshed, it should be understood that multiple rows of the even memory banks 12 and the odd memory banks 13 may instead or also be refreshed. In this manner, the bank control blocks 22 may refresh one or more rows of all memory banks 11 of the memory device 10 of FIG. 1 in response to each $REF_{ab}$ command 56 performing one refresh operation.

Figure 4:
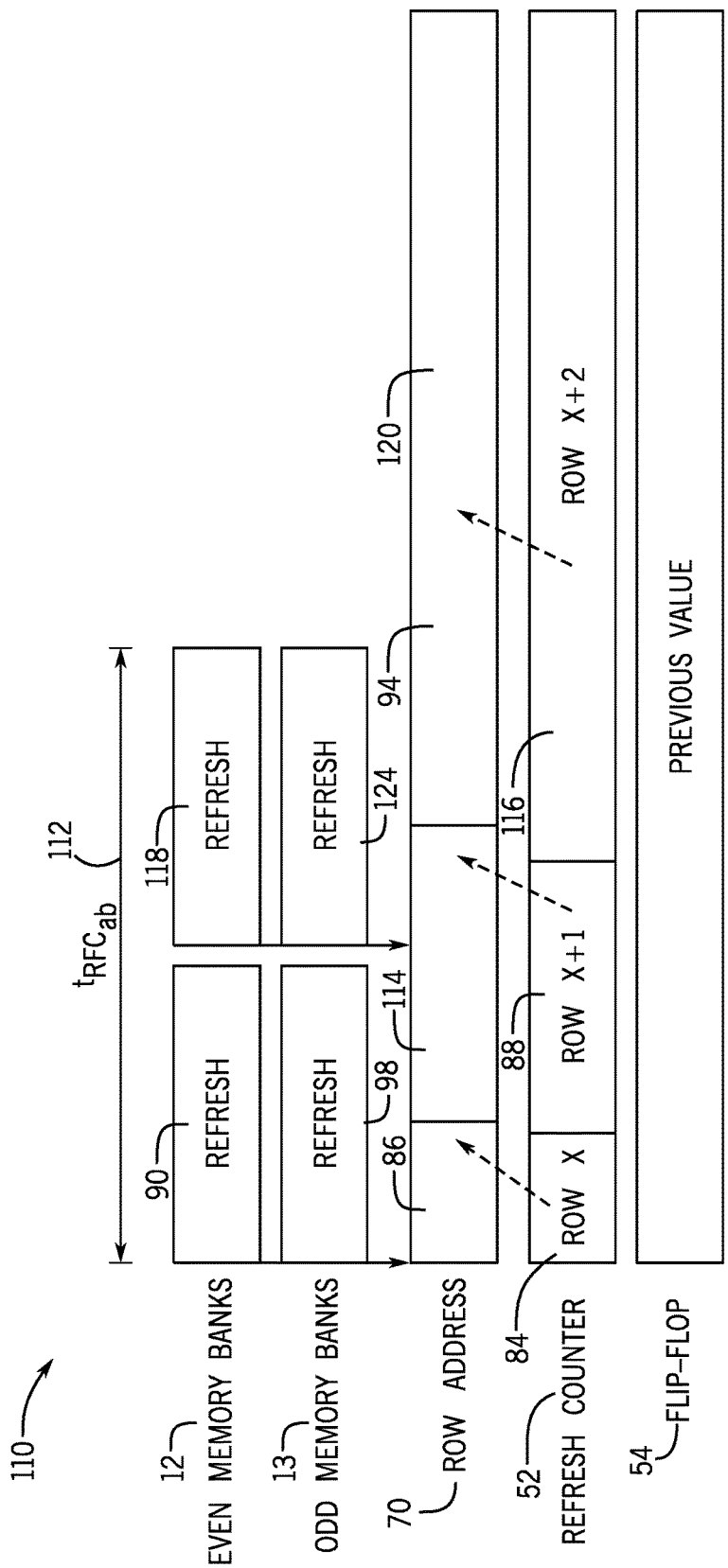
FIG. 4 is an example timing diagram illustrating bank control blocks performing a command that performs multiple refresh operations on one or more rows of all memory banks of the memory device of FIG. 1 using a shared address path, according to an embodiment of the present disclosure.

FIG. 4 is an example timing diagram 110 illustrating the bank control blocks 22 performing the $REF_{ab}$ command 56 by performing multiple refresh operations on one or more rows of all memory banks 11 of the memory device 10 of FIG. 1 using the shared address path 40, according to an embodiment of the present disclosure. In particular, the memory device 10 may be operating in the FGR 1× mode. As such, the bank control blocks 22 may perform two refresh operations on all memory banks 11 of the memory device 10 in response to each $REF_{ab}$ command 56. However, it should be understood that the bank control blocks 22 may perform any suitable number of refresh operations of all memory banks 11 of the memory device 10. As illustrated, the two refresh operations refresh two rows of the memory banks 11. However, it should be understood that the bank control blocks 22 may refresh any suitable number of rows of all memory banks 11 of the memory device 10. Each refresh operation performed by the $REF_{ab}$ command 56 may take $t_{RFCab}$ ns (nanoseconds) 112. For example, in the case of the memory device 10 operating in the FGR 1× mode, $t_{RFCab}$ 112 may be approximately on the order of 195 ns. In response to receiving the $REF_{ab}$ command 56 (e.g., at the command decoder 32), the even bank control blocks 23 may first refresh the even memory banks 12 while (e.g., simultaneously) the odd bank control blocks 24 refresh the odd memory banks 13. As mentioned above, because the even memory banks 12 and the odd memory banks 13 are being refreshed during the $REF_{ab}$ command 56, no memory banks 11 of the memory device 10 may be activated (e.g., for read/write operations).

For example, in response to receiving the $REF_{ab}$ command 56, the row address output circuit 50 may output the row address (i.e., Row X 84) in the counter 52 on the shared address path 40 to store in the register 68 as the row address 70 (i.e., as shown in portion 86) to be captured to perform refresh and/or access (e.g., read/write) operations. The refresh counter 52 may then increment the stored row address (i.e., from Row X 84 to Row X+1 88). The even bank control blocks 23 and the odd bank control blocks 24 may capture the row address 70 (i.e., Row X 84) and refresh 90 the row address 70 in the even memory banks 12 and the odd memory banks 13.

When the register 68 is available to store a new row address 70, the row address output circuit 50 may then output the incremented row address (i.e., Row X+1 88) in the counter 52 on the shared address path 40 to store in the register 68 as the row address 70 (i.e., as shown in portion 114) to be captured to perform a refresh operation. The counter 52 may then increment the stored row address (i.e., from Row X+1 88 to Row X+2 116). The even bank control blocks 23 and the odd bank control blocks 24 may capture the row address 70 (i.e., Row X+1 88) and refresh 118, 124 the row address 70 in the even memory banks 12 and the odd memory banks 13.

Because the flip-flop 54 may store a row address in response to a first (e.g., after the memory banks 11 are synchronized) $REF_{sb}$ command 58, 60 that performs a refresh operation on one or more rows of a set (e.g., even or odd) of memory banks 11, the flip-flop 54 may not update its value based on the $REF_{ab}$ command 56. As such, the flip-flop 54 may store a previous value (stored during a previous first $REF_{sb}$ command 58, 60) or no value.

In this manner, the bank control blocks 22 may refresh multiple rows of all memory banks 11 of the memory device 10 of FIG. 1 in response to each REF$_{ab}$ command 56 performing multiple refresh operations.

Figure 5:
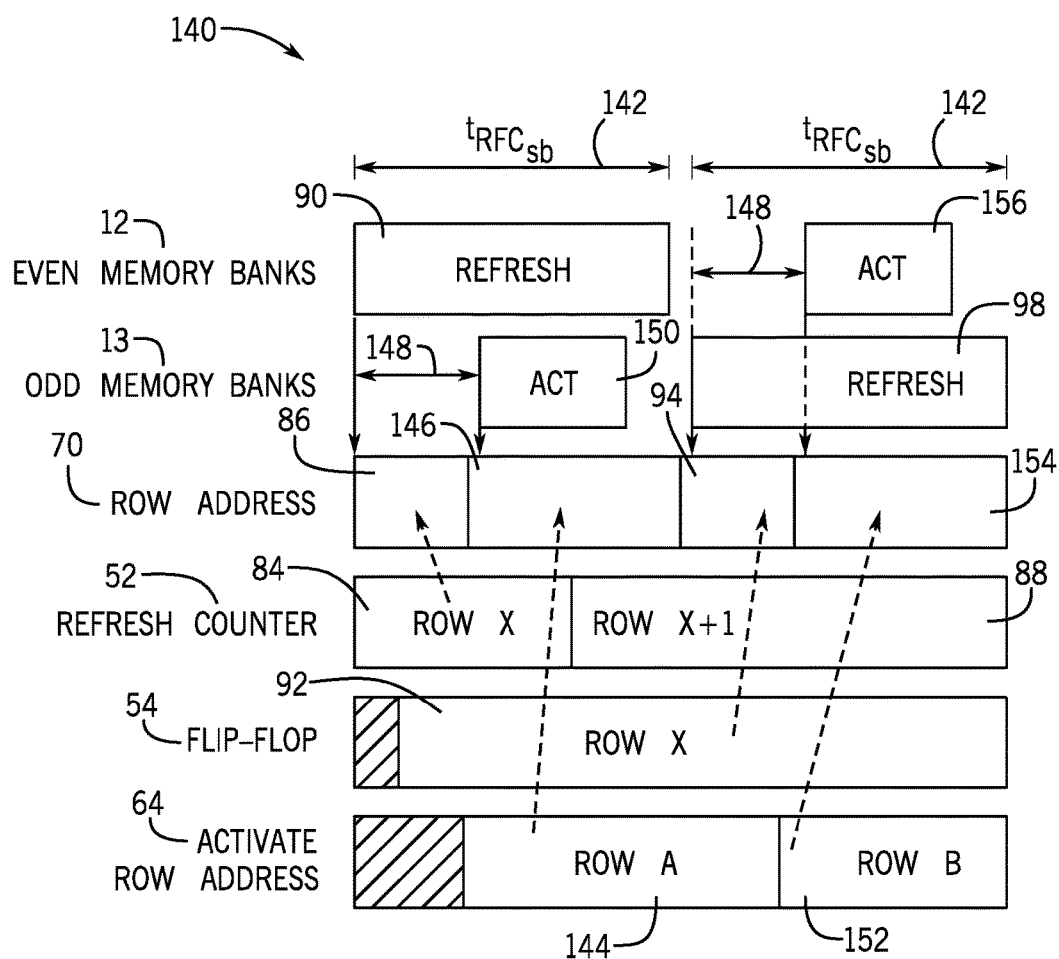
FIG. 5 is an example timing diagram illustrating bank control blocks performing a command that performs one refresh operation on one or more rows of a set (e.g., even or odd) of memory banks of the memory device of FIG. 1 using a shared address path, according to an embodiment of the present disclosure.

FIG. 5 is an example timing diagram 140 illustrating the bank control blocks 22 performing the REF$_{sb}$ command 58, 60 by performing one refresh operation on one or more rows of a set (e.g., even or odd) of memory banks 11 of the memory device 10 of FIG. 1 using the shared address path 40, according to an embodiment of the present disclosure. In particular, the memory device 10 may be operating in the FGR 2× mode. Each refresh operation performed by the REF$_{sb}$ command 58, 60 may take t$_{RFCsb}$ ns (nanoseconds) 142. For example, in the case of the memory device 10 operating in the FGR 2× mode, t$_{RFCsb}$ 142 may be approximately on the order of 100 ns. In response to receiving the REF$_{sb}$(Even) command 58 (e.g., at the command decoder 32), the even bank control blocks 23 may refresh the even memory banks 12. Similarly, in response to receiving the REF$_{sb}$(Odd) command 60 (e.g., at the command decoder 32), the odd bank control blocks 24 may refresh the odd memory banks 13. During a REF$_{sb}$ command 58, 60, while one set of memory banks 11 (e.g., the even memory banks 12) are being refreshed, another set of memory banks 11 (e.g., the odd memory banks 13) may be activated (e.g., for read/write operations).

For example, in response to receiving the REF$_{sb}$(Even) command 58, the row address output circuit 50 may output the row address (i.e., Row X 84) in the counter 52 on the shared address path 40 to store in the register 68 as the row address 70 (i.e., as shown in portion 86) to be captured to perform a refresh operation. The counter 52 may then increment the stored row address (i.e., from Row X 84 to Row X+1 88). The even bank control blocks 23 may capture the row address 70 (i.e., Row X 84) and refresh 90 the row address 70 in the even memory banks 12. Additionally, because the REF$_{sb}$(Even) command 58 is the first (e.g., after the memory banks 11 are synchronized) refresh command, the flip-flop 54 may store the row address (i.e., Row X 92) output by the counter 52.

While the refresh operation 90 is performed on the even memory banks 12 via the REF$_{sb}$(Even) command 58, the odd memory banks 13 may be activated (e.g., for read/write operations). For example, in response to receiving an activate (ACT) command (e.g., at the command decoder 32), and when the register 68 is available to store a new row address 70, the row address output circuit 50 may output an activate row address 64 (i.e., Row A 144) of the odd memory banks 13 on the shared address path 40 to store in the register 68 as the row address 70 (i.e., as shown in portion 146) to be captured to perform an access (e.g., read/write) operation. After a delay time 148 (e.g., t$_{RRD}$) associated with a delay between (consecutive) activations, one or more odd bank control blocks 24 may activate 150 the row address 70 (i.e., Row A 144) of one or more odd memory banks 13 to, for example, read from or write to the row address 70. In some embodiments, multiple activate commands may be received and multiple activations 150 may be performed while the refresh operation 90 is performed on the even memory banks 12 via the REF$_{sb}$(Even) command 58 (e.g., depending on the delay 148, the time it takes to perform the activation 150, and the time it takes to perform the refresh operation 90).

In response to receiving the REF$_{sb}$(Odd) command 60, and when the register 68 is available to store a new row address 70, the row address output circuit 50 may output the row address (i.e., Row X 92) stored in the flip-flop 54 on the shared address path 40 to store in the register 68 as the row address 70 (i.e., as shown in portion 94) to be captured to perform a refresh operation. The odd bank control blocks 24 may capture the row address 70 (i.e., Row X 92) and refresh 98 the row address 70 in the odd memory banks 13.

While the refresh operation 98 is performed on the odd memory banks 13 via the REF$_{sb}$(Odd) command 60, the even memory banks 12 may be activated (e.g., for read/write operations). For example, in response to receiving the activate command (e.g., at the command decoder 32), and when the register 68 is available to store a new row address 70, the row address output circuit 50 may output an activate row address 64 (i.e., Row B 152) of the even memory banks 12 on the shared address path 40 to store in the register 68 as the row address 70 (i.e., as shown in portion 154) to be captured to perform an access (e.g., read/write) operation. After a delay 148 (e.g., t$_{RRD}$), one or more even bank control blocks 23 may activate 156 the row address 70 (i.e., Row B 152) of one or more even memory banks 12 to, for example, read from or write to the row address 70. In some embodiments, multiple activate commands may be received and multiple activations 156 may be performed while the refresh operation 98 is performed on the odd memory banks 13 via the REF$_{sb}$(Odd) command 60 (e.g., depending on the delay 148, the time it takes to perform the activation 156, and the time it takes to perform the refresh operation 98).

While the example described in the timing diagram 140 of FIG. 5 illustrates one row (e.g., Row X 84) of the even memory banks 12 and the odd memory banks 13 being refreshed, it should be understood that multiple rows of the even memory banks 12 and the odd memory banks 13 may instead or also be refreshed. In this manner, the bank control blocks 22 may refresh one row of a set (e.g., even or odd) memory banks 11 of the memory device 10 of FIG. 1 in response to each REF$_{sb}$ command 58, 60 performing one refresh operation.

Figure 6:
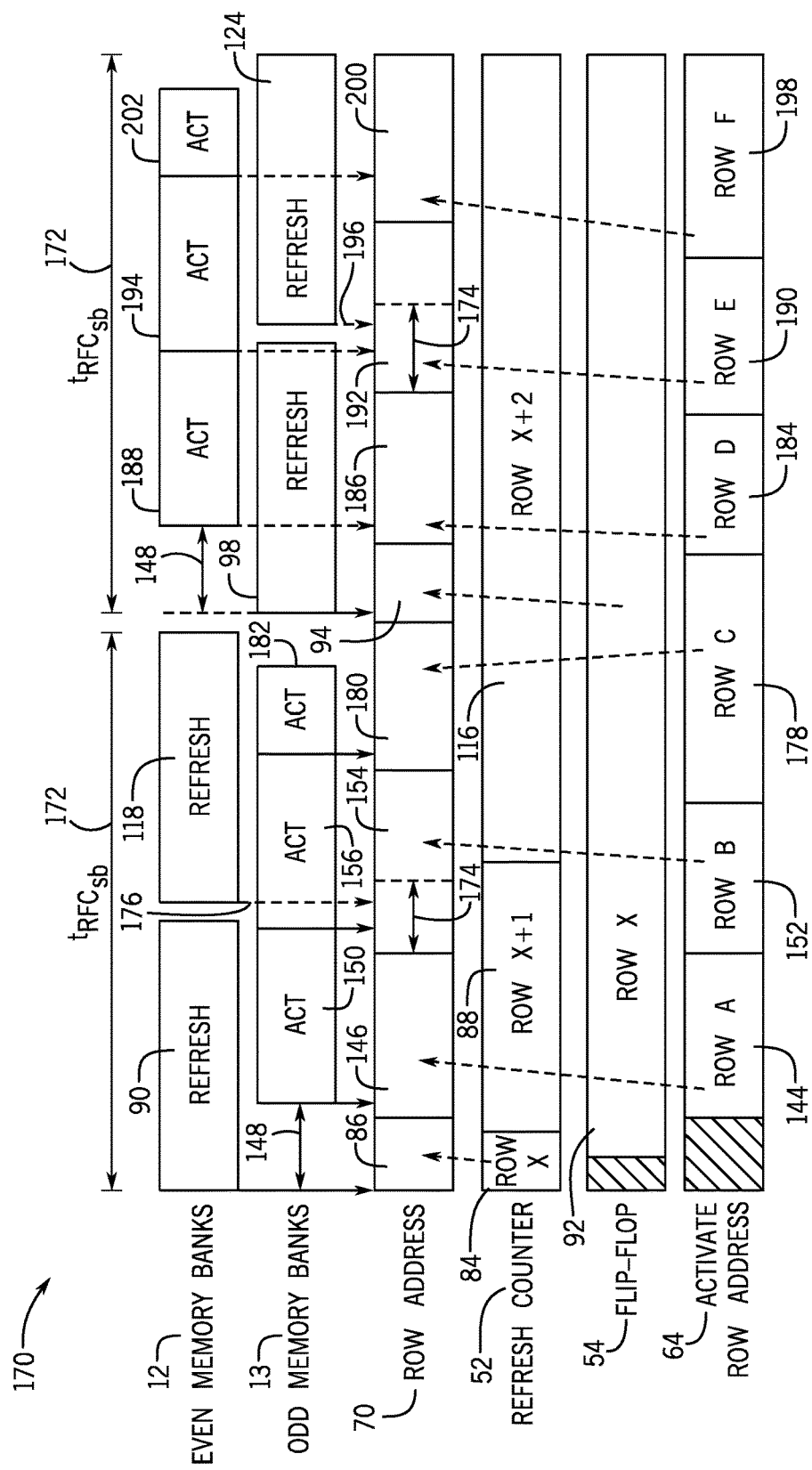
FIG. 6 is an example timing diagram illustrating bank control blocks performing a command that performs multiple refresh operations on one or more rows of a set (e.g., even or odd) of memory banks of the memory device of FIG. 1 using a shared address path, according to an embodiment of the present disclosure.

FIG. 6 is an example timing diagram 170 illustrating the bank control blocks 22 performing the REF$_{sb}$ command 58, 60 by performing multiple refresh operations on one or more rows of a set (e.g., even or odd) of memory banks 11 of the memory device 10 of FIG. 1 using the shared address path 40, according to an embodiment of the present disclosure. In particular, the memory device 10 may be operating in the FGR 1× mode. As such, the bank control blocks 22 may perform two refresh operations on the even memory banks 12 or the odd memory banks 13 of the memory device 10 in response to each REF$_{sb}$ command 58, 60. However, it should be understood that the bank control blocks 22 may perform any suitable number of refresh operations of the even memory banks 12 or the odd memory banks 13 of the memory device 10.

As illustrated, the two refresh operations refresh two rows of the even memory banks 12 or the odd memory banks 13. However, it should be understood that the bank control blocks 22 may refresh any suitable number of rows of the even memory banks 12 or the odd memory banks 13 of the memory device 10. Each refresh operation performed by the REF$_{sb}$ command 58, 60 may take t$_{RFCsb}$ ns (nanoseconds) 172 to complete. For example, in the case of the memory device 10 operating in the FGR 1× mode, t$_{RFCsb}$ 172 may be approximately on the order of 130 ns. In response to receiving the REF$_{sb}$(Even) command 58 (e.g., at the command decoder 32), the even bank control blocks 23 may refresh the even memory banks 12. Similarly, in response to receiving the REF$_{sb}$(Odd) command 60 (e.g., at the command decoder 32), the odd bank control blocks 24 may refresh the odd memory banks 13. During a REF$_{sb}$ command 58, 60, while one set of memory banks 11 (e.g., the even memory banks 12) are being refreshed, another set of memory banks 11 (e.g., the odd memory banks 13) may be activated (e.g., for read/write operations).

For example, in response to receiving the $REF_{sb}$(Even) command 58, the row address output circuit 50 may output the row address (i.e., Row X 84) in the counter 52 on the shared address path 40 to store in the register 68 as the row address 70 (i.e., as shown in portion 86) to be captured to perform an access (e.g., read/write) operation. The counter 52 may then increment the stored row address (i.e., from Row X 84 to Row X+1 88). The even bank control blocks 23 may capture the row address 70 (i.e., Row X 84) and refresh 90 the row address 70 in the even memory banks 12. Additionally, because the $REF_{sb}$(Even) command 58 is the first (e.g., after the memory banks 11 are synchronized) refresh command, the flip-flop 54 may store the row address (i.e., Row X 92) output by the counter 52.

While the first refresh operation 90 is performed on the even memory banks 12 via the $REF_{sb}$(Even) command 58, the odd memory banks 13 may be activated (e.g., for read/write operations). For example, in response to receiving a first activate command (e.g., at the command decoder 32) corresponding to the odd memory banks 13 when the register 68 is available to store a new row address 70, the row address output circuit 50 may output a first activate row address 64 (i.e., Row A 144) of the odd memory banks 13 on the shared address path 40 to store in the register 68 as the row address 70 (i.e., as shown in portion 146) to be captured to perform an access (e.g., read/write) operation. After a delay time 148 (e.g., $t_{RRD}$), one or more odd bank control blocks 24 may activate 150 the row address 70 (i.e., Row A 144) of one or more odd memory banks 13 to, for example, read from or write to the row address 70.

In some embodiments, multiple activate commands may be received and multiple activations 150 may be performed while the first refresh operation 90 is performed on the even memory banks 12 via the $REF_{sb}$(Even) command 58. In some embodiments, the number of activate command and/or activations 150 may be based at least in part on the delay 148, the time it takes to perform the activation 150, and/or the time it takes to perform the first refresh operation 90. However, in the case of refreshing multiple rows of a set of memory banks 11, such as refreshing two rows of the even memory banks 12 or the odd memory banks 13 in response to a $REF_{sb}$ command 58, 60, a refresh operation of subsequent rows (e.g., a second row) may be performed at or near approximately the same time as an activate command. As a result, and because the shared address path 40 is used (e.g., instead of multiple address paths, where one address path might be used for a refresh operation and another for an activation operation), the wrong address may be captured, and either the refresh operation may be performed on the wrong row address (i.e., the row address of the memory bank to be activated) or the activation operation may be performed on the wrong row address (i.e., the row address of the memory banks to be refreshed). As such, instead of capturing the row address 70 to refresh (e.g., 118) subsequent rows (e.g., a second row) of a set of memory banks 11 (e.g., the even memory banks 12), the bank control blocks 22 (e.g., the even bank control blocks 23) associated with the set of memory banks 11 may internally increment the row address 70 captured during a first refresh operation (e.g., 90).

For example, while the first refresh operation 90 is performed on the even memory banks 12 via the $REF_{sb}$ (Even) command 58, the odd memory banks 13 may be activated a second time. In response to receiving a second activate command (e.g., at the command decoder 32) corresponding to the odd memory banks 13, and when the register 68 is available to store a new row address 70, the row address output circuit 50 may output a second activate row address 64 (i.e., Row B 152) of the odd memory banks 13 on the shared address path 40 to store in the register 68 as the row address 70 (i.e., as shown in portion 154) to be captured to perform an access (e.g., read/write) operation. After a delay 148 (e.g., $t_{RRD}$), one or more odd bank control blocks 24 may activate 156 the row address 70 (i.e., Row B 152) of one or more odd memory banks 13 to, for example, read from or write to the row address 70.

In response to receiving the $REF_{sb}$(Even) command 58, the row address output circuit 50 may output the row address (i.e., Row X+1 88) stored in the counter 52 on the shared address path 40 in an attempt to store Row X+1 88 in the register 68 as the row address 70 (i.e., at the portion 154) to be captured to perform refresh and/or access (e.g., read/write) operations. However, in some instances, the register 68 (e.g., for a duration of time 174) may not be available to store a new row address 70, and instead retains the stored row address (i.e., Row B 152). As such, if the even bank control blocks 23 capture the row address 70 to refresh 118 the row address 70 in the even memory banks 12, the even bank control blocks 23 may capture 176 the row address 70 (i.e., Row B 152) meant for activation in the odd memory banks 13 (instead of Row X+1 88). The even bank control blocks 23 may thus refresh a wrong row in the even memory banks 12.

Instead, rather than capturing 176 the row address 70 and refreshing that row address 70 of the even memory banks 12, the even bank control blocks 23 may internally increment the row address 70 (i.e., from Row X 84 to Row X+1) captured during the first refresh operation 90, and refresh 118 the internally incremented row address (i.e., Row X+1). In this manner, the memory device 10 may refresh the even memory banks 12 while activating a row of the odd memory banks 13, and prevent a wrong row of the even memory banks 12 from being refreshed and/or a wrong row of the odd memory banks 13 from being activated. The counter 52 may then increment the stored row address (i.e., from Row X+1 88 to Row X+2 116) to account for the internally incremented row address 70 associated with the even memory banks 12. To reduce complexity in the circuitry of the memory device 10, in some embodiments, the command interface 14, the command address input circuit 21, the command decoder 32, and/or the bank control blocks 22 may guarantee that the first refresh operation 90 is performed on an even row address 70 (i.e., Row X 84), such that the least significant bit of the even row address 70 is 0. This way, internally incrementing the row address 70 is simply a matter of flipping the least significant bit (to 1).

While the first refresh operation 90 is performed on the even memory banks 12 via the $REF_{sb}$(Even) command 58, the odd memory banks 13 may be activated a third time. In response to receiving a third activate command (e.g., at the command decoder 32) corresponding to the odd memory banks 13, and when the register 68 is available to store a new row address 70, the row address output circuit 50 may output a third activate row address 64 (i.e., Row C 178) of the odd memory banks 13 on the shared address path 40 to store in the register 68 as the row address 70 (i.e., as shown in portion 180) to be captured to perform an access (e.g., read/write) operation. After a delay time 148 (e.g., $t_{RRD}$) associated with a delay between (consecutive) activations, one or more odd bank control blocks 24 may activate 182 the row address 70 (i.e., Row C 178) of one or more odd memory banks 13 to, for example, read from or write to the row address 70.

In response to receiving the $REF_{sb}$(Odd) command 60, the row address output circuit 50 may output the row address (i.e., Row X 92) in the flip-flop 54 on the shared address path 40 to store in the register 68 as the row address 70 (i.e., as shown in portion 94) to be captured to perform a refresh operation. As illustrated, if the flip-flop were not used, the row address output circuit 50 might not be able to output the correct row (i.e., Row X). That is, because the counter 52 was incremented (e.g., to Row X+2 116), it no longer stores the correct row (e.g., Row X) for the odd memory banks 13 to refresh. The odd bank control blocks 24 may capture the row address 70 (i.e., Row X 92) and refresh 98 the row address 70 in the odd memory banks 13.

While the first refresh operation 98 is performed on the odd memory banks 13 via the $REF_{sb}$(Odd) command 60, the even memory banks 12 may be activated (e.g., for read/write operations). For example, in response to receiving a first activate command (e.g., at the command decoder 32) corresponding to the even memory banks 12, and when the register 68 is available to store a new row address 70, the row address output circuit 50 may output a first activate row address 64 (i.e., Row D 184) of the even memory banks 12 on the shared address path 40 to store in the register 68 as the row address 70 (i.e., as shown in portion 186) to be captured to perform an access (e.g., read/write) operation. After a delay 148 (e.g., $t_{RRD}$), one or more even bank control blocks 23 may activate 188 the row address 70 (i.e., Row D 184) of one or more even memory banks 12 to, for example, read from or write to the row address 70.

While the first refresh operation 98 is performed on the odd memory banks 13 via the $REF_{sb}$(Odd) command 60, the even memory banks 12 may be activated a second time. In response to receiving a second activate command (e.g., at the command decoder 32) corresponding to the even memory banks 12, and when the register 68 is available to store a new row address 70, the row address output circuit 50 may output a second activate row address 64 (i.e., Row E 190) of the even memory banks 12 on the shared address path 40 to store in the register 68 as the row address 70 (i.e., as shown in portion 192) to be captured to perform an access (e.g., read/write) operation. After a delay 148 (e.g., $t_{RRD}$), one or more even bank control blocks 23 may activate 194 the row address 70 (i.e., Row D 184) of one or more even memory banks 12 to, for example, read from or write to the row address 70.

In response to receiving the $REF_{sb}$(Odd) command 60, the odd bank control blocks 24 may also internally increment the row address 70 (i.e., from Row X 92 to Row X+1) captured during the first refresh operation 98 from the flip-flop 54, and refresh 124 the internally incremented row address (i.e., Row X+1). In this manner, the memory device 10 may refresh the odd memory banks 13 while activating a row of the even memory banks 12. To reduce complexity in the circuitry of the memory device 10, in some embodiments, the command interface 14, the command address input circuit 21, the command decoder 32, and/or the bank control blocks 22 may guarantee that the first refresh operation 98 is performed on an even row address 70 (i.e., Row X 92), such that the least significant bit of the even row address 70 is 0. This way, internally incrementing the row address 70 is simply a matter of flipping the least significant bit (to 1).

While the first refresh operation 98 is performed on the odd memory banks 13 via the $REF_{sb}$(Odd) command 60, the even memory banks 12 may be activated a third time. In response to receiving a third activate command (e.g., at the command decoder 32) corresponding to the even memory banks 12, and when the register 68 is available to store a new row address 70, the row address output circuit 50 may output a third activate row address 64 (i.e., Row F 198) of the even memory banks 12 on the shared address path 40 to store in the register 68 as the row address 70 (i.e., as shown in portion 200) to be captured to perform refresh and/or access (e.g., read/write) operations. After a delay 148 (e.g., $t_{RRD}$), one or more even bank control blocks 23 may activate 202 the row address 70 (i.e., Row F 198) of one or more even memory banks 12 to, for example, read from or write to the row address 70.

In this manner, the memory device 10 may refresh a first set of memory banks 11 while activating a row of a second set of memory banks 11 to access (e.g., read data from or write data to) the row of the second set of memory banks 11, while preventing a wrong row of the first set of memory banks 11 from being refreshed or a wrong row of the second memory banks 11 from being activated (and vice versa). In some embodiments, when performing the $REF_{ab}$ command 56 by performing multiple refresh operations of all memory banks 11 of the memory device 10 as shown in FIG. 4, rather than capturing the row address 70 and refreshing that row address 70 of the memory banks 11, the bank control blocks 22 may internally increment the row address 70 (e.g., Row X 84) captured during a first refresh operation (e.g., 90), and refresh (e.g., 118) the internally incremented row address (e.g., Row X+1).

Figure 7:
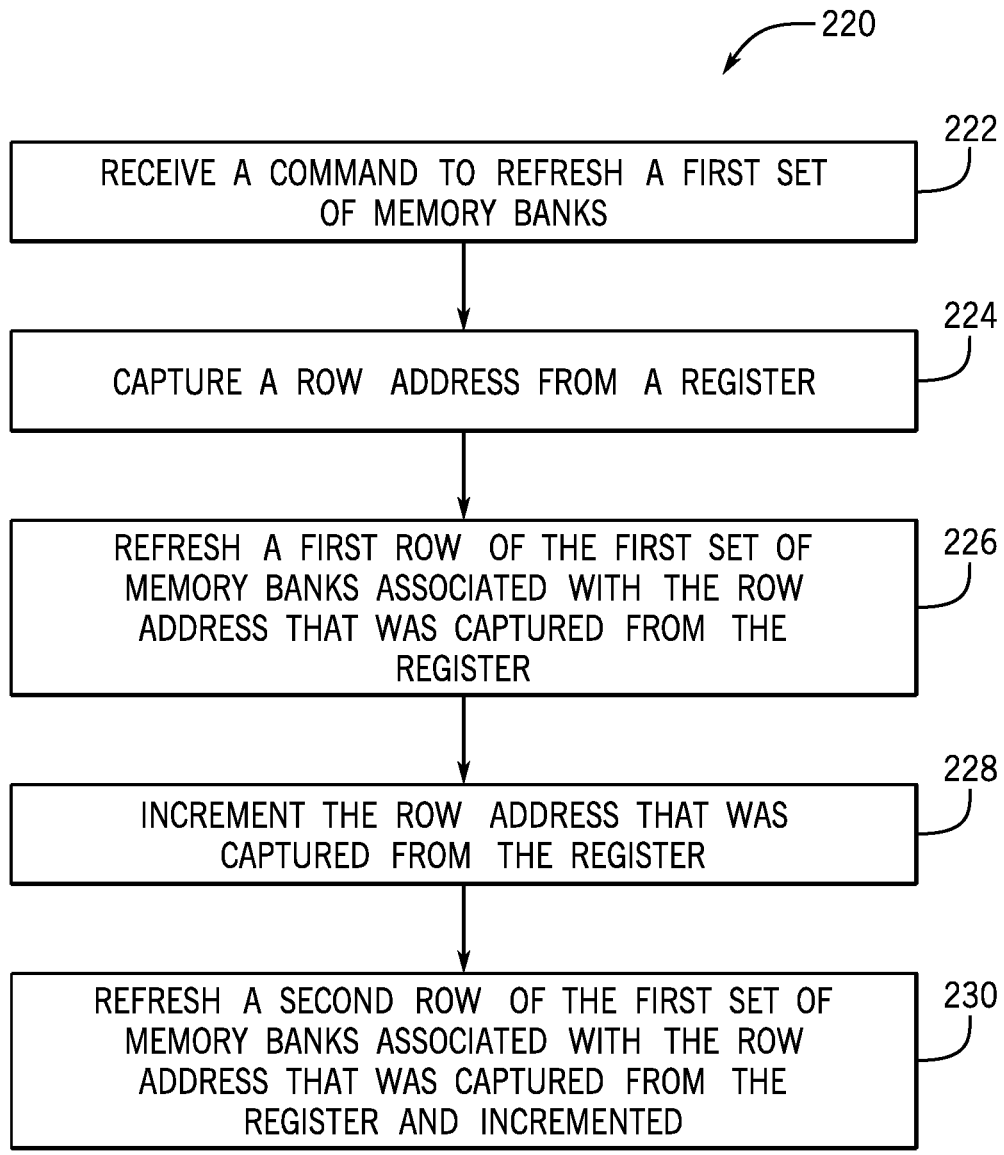
FIG. 7 is a flow diagram of a method for refreshing a first set of memory banks of the memory device of FIG. 1 while activating a row of a second set of the memory banks using a shared address path, according to an embodiment of the present disclosure.

FIG. 7 is a flow diagram of a method 220 for refreshing a first set of memory banks 11 of the memory device 10 of FIG. 1 while activating a row of a second set of the memory banks 11 using a shared address path 40, according to an embodiment of the present disclosure. In particular, performing the method 220 may result in the example timing diagram 170 of FIG. 6. The method 220 may be performed by any suitable device or combination of devices that may capture a row address from a register (e.g., 68), increment the row address captured from the register, and refresh rows of the memory banks 11. While the method 220 is described using steps in a specific sequence, it should be understood that the present disclosure contemplates that the described steps may be performed in different sequences than the sequence illustrated, and certain described steps may be skipped or not performed altogether. In some embodiments, at least some of the steps of the method 220 may be performed by bank control blocks 22 of the memory device 10, as described below.

As illustrated, the bank control blocks 22 receive (process block 222) a command to refresh a first set (e.g., the even memory banks 12 or the odd memory banks 13) of memory banks 11. For example, the command may be the $REF_{sb}$ (Even) command 58 or the $REF_{sb}$(Odd) command 60.

The bank control blocks (e.g., 23, 24) associated with the first set of memory banks 11 capture (process block 224) a row address 70 from a register 68 of the memory device 10. The register 68 may store an output of the multiplexer 62 of the row address output circuit 50 via the shared address path 40. As such, the register 68 may store the row address stored in the counter 52, the row address stored in flip-flop 54, or the activate row address 64.

The bank control blocks associated with the first set of memory banks 11 refresh (process block 226) a first row of the first set of memory blocks associated with the row address 70 that was captured from the register 68. In particular, the first row of the first set of memory blocks may have an address that is the same as the row address 70 that was captured from the register 68.

The bank control blocks associated with the first set of memory banks 11 increment (process block 228) the row address 70 that was captured from the register 68. The row address 70 may be incremented internally, such that the row address 70 is stored and incremented in a memory device (e.g., a register) local to the bank control blocks 22. In particular, the row addresses stored in the counter 52 and/or the flip-flop 54 may not change when the row address 70 is incremented. However, the counter 52 may or may not increment its stored row address to account for the internally incremented row address 70.

The bank control blocks associated with the first set of memory banks 11 refresh (process block 230) a second row of the first set of memory blocks associated with the row address 70 that was captured from the register 68 and incremented. In particular, the second row of the first set of memory blocks may have an address that is the same as the row address 70 that was captured from the register 68 and incremented. In this manner, the bank control blocks 22 may refresh a first set of memory banks while activating a row of a second set of memory banks, and prevent a wrong row of the first set of memory banks from being refreshed and/or a wrong row of the second set of memory banks from being activated.

In some embodiments, synchronization or pairing of rows in the memory banks 11 being refreshed may be enforced or maintained. For example, the memory banks 11 of the memory device 10 may be synchronized or paired when the row addresses of the most recently refreshed row of each memory bank 11 are the same. The even bank control blocks 23 may refresh the even memory banks 12 in response to receiving the REF$_{sb}$(Even) command 58, and then the counter 52 may be incremented. If the memory device 10 is operating in the FGR 1× mode, the even bank control blocks 23 may refresh two rows of the even memory banks 12, and the counter 52 may be incremented twice. If the memory device 10 is operating in the FGR 2× mode, the even bank control blocks 23 may refresh one row of the even memory banks 12, and the counter 52 may be incremented once.

To enforce synchronization or pairing, the odd bank control blocks 24 may refresh the odd memory banks 13 in response to receiving the REF$_{sb}$(Odd) command 60. Thus, the row addresses of the most recently refreshed row of the even memory banks 12 and the odd memory banks 13 are the same. However, in some instances, instead of the odd bank control blocks 24 receiving the REF$_{sb}$(Odd) command 60, the even bank control blocks 23 may receive, for example, the REF$_{ab}$ command 56 or the REF$_{sb}$(Even) command 58 again. Incrementing the counter 52 in this case may result in desynchronizing the memory banks 11.

To enforce synchronization or pairing, the row address output circuit 50 may select the output of the counter 52 (e.g., to send to the register 68 to store as the row address 70) in response to receiving the REF$_{ab}$ command 56 or a first REF$_{sb}$ command when the memory banks 11 are synchronized (e.g., such that the row addresses of the most recently refreshed row of each memory bank 11 are the same). If the first REF$_{sb}$ command is received, the flip-flop 54 captures or stores the output of the counter 52. Moreover, if the first REF$_{sb}$ command is received, the memory banks 11 are unsynchronized (as the row addresses of the most recently refreshed row of each memory bank 11 are not the same). If the memory banks 11 are unsynchronized, the row address output circuit 50 may select the output of the flip-flop 54 for the refresh commands (e.g., the REF$_{ab}$ command 56, the first REF$_{sb}$ command again, or a second REF$_{sb}$ command) until the memory banks 11 are synchronized. The memory banks 11 may be synchronized once the row addresses of the most recently refreshed row of each memory bank 11 are the same (e.g., after implement the second REF$_{sb}$ command). This process may then be repeated. In this manner, synchronization or pairing of the rows in the memory banks 11 being refreshed may be enforced or maintained.

In the above example process, it is assumed that the two REF$_{sb}$ commands each refer to two sets of memory banks 11 (e.g., the even memory banks 12 and the odd memory banks 13) that compose the entire set of memory banks 11. For example, there may be four sets of memory banks, and four corresponding REF$_{sb}$ commands (e.g., a REF$_{sb}$(0) command, a REF$_{sb}$(1) command, a REF$_{sb}$(2) command, and a REF$_{sb}$(3) command). In such an example, if a first refresh command is performed (e.g., the REF$_{sb}$(0) command), the memory banks 11 are synchronized after the remaining refresh commands are also performed (e.g., the REF$_{sb}$(1) command, the REF$_{sb}$(2) command, and the REF$_{sb}$(3) command).

As an example, Table 1 below illustrates operation of the counter 52 and the flip-flop 54 in response to receiving REF$_{ab}$ commands 56 when the memory banks 11 are initially synchronized. The flip-flop 54 initially stores a value of row address X, though the initial value may be any given value.

TABLE 1

|  | REF$_{ab}$ | REF$_{ab}$ | REF$_{ab}$ | REF$_{ab}$ | REF$_{ab}$ |
|---|---|---|---|---|---|
| Counter | X + 1 | X + 2 | X + 3 | X + 4 | X + 5 |
| Flip-flop | X | X | X | X | X |

As illustrated in Table 1, with the memory banks 11 initially synchronized, in response to each REF$_{ab}$ command 56, the counter 52 is incremented. Additionally, for each REF$_{ab}$ command 56, the row address output circuit 50 selects the output of the counter 52. As illustrated, "+1" indicates incrementing the row address X, where the "+1" corresponds to performing one refresh operation per refresh command in the FGR 2× mode (e.g., in a given refresh time ($t_{RFC}$)). When in the FGR 1× mode, each increment (+1) may be replaced by "+2" to correspond to performing two refresh operations per refresh command (e.g., in the given refresh time ($t_{RFC}$)).

As another example, Table 2 below illustrates operation of the counter 52 and the flip-flop 54 in response to receiving alternating REF$_{sb}$ commands when the memory banks 11 are initially synchronized. For Table 2 and the subsequent Tables, it is assumed that the two REF$_{sb}$ commands each refer to two sets of memory banks 11 (e.g., the even memory banks 12 and the odd memory banks 13) that compose the entire set of memory banks 11. However, it should be understood that any number of sets of memory banks and corresponding REF$_{sb}$ commands are contemplated.

TABLE 2

|  | REF$_{sb}$0 | REF$_{sb}$1 | REF$_{sb}$0 | REF$_{sb}$1 |
|---|---|---|---|---|
| Counter | X + 1 |  | X + 2 |  |
| Flip-flop | X + 1 | X + 1 | X + 2 | X + 2 |

TABLE 2-continued

|  | $REF_{sb}0$ | $REF_{sb}1$ | $REF_{sb}0$ | $REF_{sb}1$ |
|---|---|---|---|---|
| Counter | X + 3 |  | X + 4 |  |
| Flip-flop | X + 3 | X + 3 | X + 4 | X + 4 |

As illustrated in Table 2, when the memory banks 11 are synchronized, in response to each first $REF_{sb}$ command (e.g., each $REF_{sb}(0)$ command), the flip-flop 54 stores the value of the counter 52 (as illustrated by the "$REF_{sb}0$" columns). The counter 52 is then incremented. For each first $REF_{sb}$ command, the row address output circuit 50 selects the output of the counter 52. When the memory banks 11 are unsynchronized, in response to each second $REF_{sb}$ command (e.g., each $REF_{sb}(1)$ command), the row address output circuit 50 selects the output of the flip-flop 54 (and the counter 52 is not incremented).

As yet another example, Table 3 below illustrates operation of the counter 52 and the flip-flop 54 in response to receiving $REF_{ab}$ commands 56 and alternating $REF_{sb}$ commands when the memory banks 11 are initially synchronized.

TABLE 3

|  | $REF_{ab}$ | $REF_{sb}0$ | $REF_{sb}1$ | $REF_{ab}$ |
|---|---|---|---|---|
| Counter | X + 1 | X + 2 |  | X + 3 |
| Flip-flop | X | X + 2 | X + 2 | X + 2 |
|  | $REF_{sb}1$ | $REF_{sb}0$ | $REF_{sb}0$ | $REF_{sb}1$ |
| Counter | X + 4 |  | X + 5 |  |
| Flip-flop | X + 4 | X + 4 | X + 5 | X + 5 |

As illustrated in Table 3, when the memory banks 11 are synchronized, in response to each $REF_{ab}$ command 56, the counter 52 is incremented. Similarly, in response to each first $REF_{sb}$ command (e.g., the first and third $REF_{sb}(0)$ commands and the second $REF_{sb}(1)$ command), the flip-flop 54 stores the value of the counter 52 (as illustrated by the first and third "$REF_{sb}0$" columns and the second $REF_{sb}(1)$ column). The counter 52 is then incremented. Additionally, for each first $REF_{sb}$ command, the row address output circuit 50 selects the output of the counter 52. When the memory banks 11 are unsynchronized, in response to each second $REF_{sb}$ command (e.g., the first and third $REF_{sb}(1)$ commands and the second $REF_{sb}(0)$ command), the row address output circuit 50 selects the output of the flip-flop 54 (and the counter 52 is not incremented).

As a further example, Table 4 below illustrates operation of the counter 52 and the flip-flop 54 in response to receiving an $REF_{ab}$ command 56 when the memory banks 11 are not synchronized.

TABLE 4

|  | $REF_{ab}$ | $REF_{sb}0$ | $REF_{ab}$ |
|---|---|---|---|
| Counter | X + 1 | X + 2 |  |
| Flip-flop | X |  X + 2 | X + 2 |

As illustrated in Table 4, with the memory banks 11 synchronized, in response to a first $REF_{ab}$ command 56, the counter 52 is incremented. Additionally, for the first $REF_{ab}$ command 56, the row address output circuit 50 selects the output of the counter 52. Similarly, in response to a first $REF_{sb}$ command (e.g., a $REF_{sb}(0)$ command), the flip-flop 54 stores the value of the counter 52 (as illustrated by the "$REF_{sb}0$" column). The counter 52 is then incremented. Additionally, in response to receiving the first $REF_{sb}$ command, the row address output circuit 50 selects the output of the counter 52. However, after the first $REF_{sb}$ command, the memory banks 11 are unsynchronized. As such, in response to receiving a second $REF_{ab}$ command 56, while the memory banks 11 are unsynchronized, the row address output circuit 50 selects the output of the flip-flop 54, and the counter 52 is not incremented. Moreover, as long as the memory banks 11 are unsynchronized, the row address output circuit 50 may select the output of the flip-flop 54, and the counter 52 may not be incremented. Once the memory banks 11 are synchronized (e.g., after receiving a $REF_{sb}$ command corresponding to the remaining memory banks, such as a $REF_{sb}(1)$ command), the counter 52 may be incremented.

As yet another example, Table 5 below illustrates operation of the counter 52 and the flip-flop 54 in response to receiving $REF_{sb}$ commands when the memory banks 11 are not synchronized.

TABLE 5

|  | $REF_{sb}0$ | $REF_{sb}1$ | $REF_{sb}1$ | $REF_{sb}1$ |
|---|---|---|---|---|
| Counter | X + 1 |  | X + 2 |  |
| Flip-flop | X + 1 | X + 1 | X + 2 | X + 2 |
|  | $REF_{sb}1$ | $REF_{sb}0$ | $REF_{ab}$ | $REF_{ab}$ |
| Counter |  |  | X + 3 | X + 4 |
| Flip-flop | X + 2 | X + 2 | X + 2 | X + 2 |

As illustrated in Table 5, with the memory banks 11 synchronized, in response to a first $REF_{sb}$ command (e.g., a first $REF_{sb}(0)$ command), the flip-flop 54 stores the value of the counter 52 (as illustrated by the first "$REF_{sb}0$" column). The counter 52 is then incremented. Additionally, in response to receiving the first $REF_{sb}$ command, the row address output circuit 50 selects the output of the counter 52. As a result, the memory banks 11 are unsynchronized. In response to a second $REF_{sb}$ command corresponding to the remaining memory banks (e.g., a first $REF_{sb}(1)$ command), the row address output circuit 50 selects the output of the flip-flop 54 (and the counter 52 is not incremented—as it already has been incremented previously in response to receiving the first $REF_{sb}(0)$ command). As a result, the memory banks 11 are synchronized.

With the memory banks 11 resynchronized, in response to a third $REF_{sb}$ command (e.g., a second $REF_{sb}(1)$ command), the flip-flop 54 stores the value of the counter 52 (as illustrated by the second "$REF_{sb}1$" column). The counter 52 is then incremented. Additionally, in response to receiving the third $REF_{sb}$ command, the row address output circuit 50 selects the output of the counter 52. As a result, the memory banks 11 are unsynchronized. A fourth $REF_{sb}$ command (e.g., a third $REF_{sb}(1)$ command) is then received that does not correspond to the remaining memory banks (e.g., as opposed to another $REF_{sb}(0)$ command). As such, the row address output circuit 50 selects the output of the flip-flop 54 (and the counter 52 is not incremented). As a result, the memory banks 11 remain unsynchronized.

Similarly, after receiving a fifth $REF_{sb}$ command (e.g., a fourth $REF_{sb}(1)$ command) that does not correspond to the remaining memory banks, the row address output circuit 50 again selects the output of the flip-flop 54 (and the counter 52 is not incremented) and the memory banks 11 remain unsynchronized. After receiving a sixth $REF_{sb}$ command (e.g., a second $REF_{sb}(0)$ command) that corresponds to the remaining memory banks, the row address output circuit 50 selects the output of the flip-flop 54 (and the counter 52 is not incremented), and the memory banks 11 are synchronized.

As such, in response to receiving a first $REF_{sb}$ command 56, the counter 52 is incremented because the memory banks 11 are synchronized. Similarly, in response to receiving a second $REF_{sb}$ command 56, the counter 52 is incremented again because the memory banks 11 are still synchronized. Additionally, for each $REF_{sb}$ command 56, the row address output circuit 50 selects the output of the counter 52. In this manner, synchronization or pairing of the rows in the memory banks 11 being refreshed may be enforced or maintained.

Figure 8:
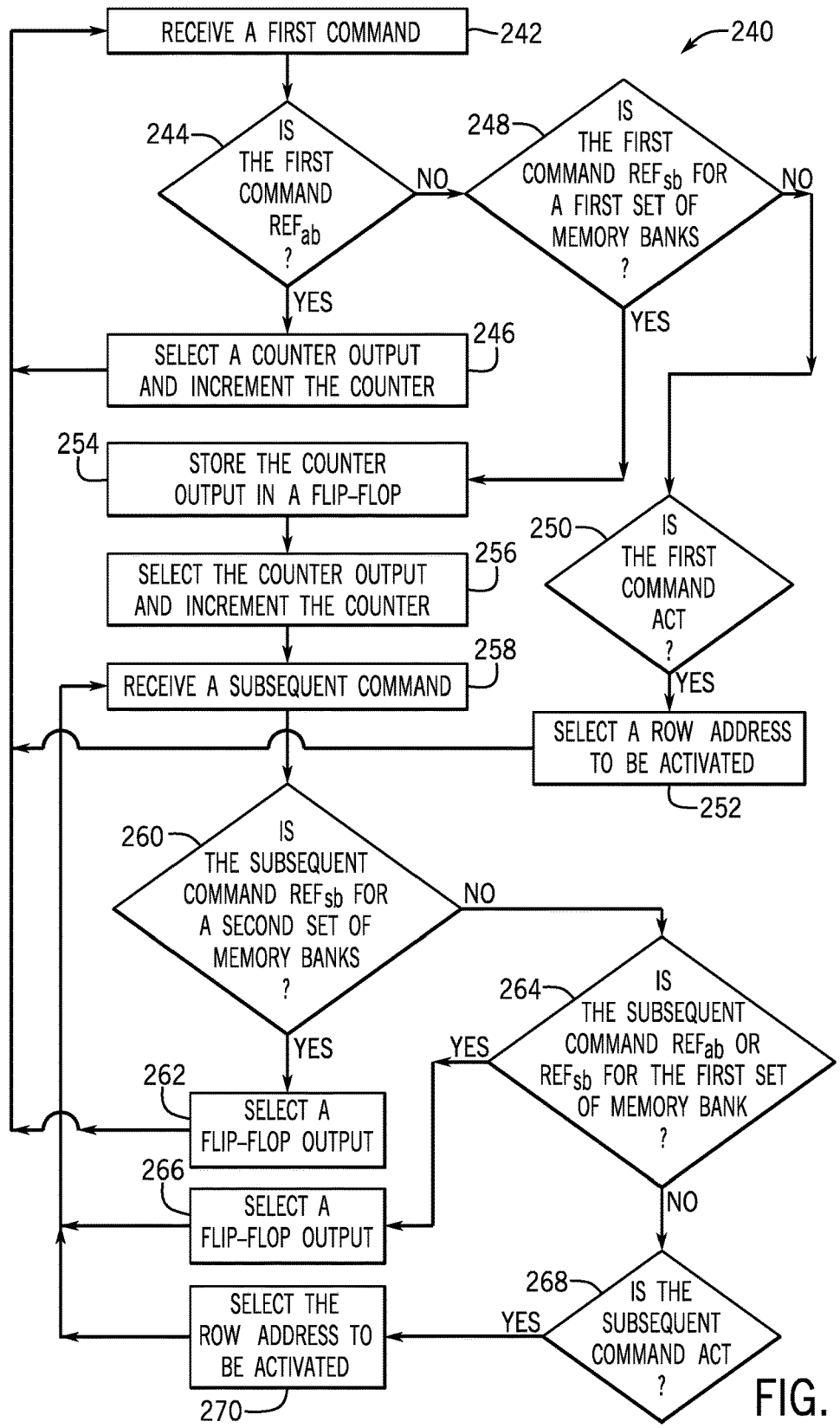
FIG. 8 is a flow diagram of a method for maintaining synchronization of rows in the memory banks of the memory device 10 of FIG. 1 using a shared address path, according to an embodiment of the present disclosure.

FIG. 8 is a flow diagram of a method 240 for enforcing or maintaining synchronization or pairing of rows in the memory banks 11 of the memory device 10 of FIG. 1 using a shared address path 40, according to an embodiment of the present disclosure. The method 240 may be performed by any suitable device or combination of devices that may receive a command, determine the type of the command, and select a counter output and a flip-flop output. While the method 240 is described using steps in a specific sequence, it should be understood that the present disclosure contemplates that the described steps may be performed in different sequences than the sequence illustrated, and certain described steps may be skipped or not performed altogether. In some embodiments, at least some of the steps of the method 240 may be performed by the row address output circuit 50, as described below. However, it should be understood that any suitable device or combination of devices is contemplated to perform the method 240, such as the command interface 14, the command address input circuit 21, the command decoder 32, and the like.

It may be assumed that, at the beginning of the method 240, the memory banks 11 are synchronized or paired, such that the row addresses of the most recently refreshed row of each memory bank 11 are the same. As illustrated, the row address output circuit 50 receives (process block 242) a first command. The row address output circuit 50 determines (decision block 244) whether the command is the $REF_{ab}$ command 56.

If so, the row address output circuit 50 selects (process block 246) a counter output of the counter 52 and increments the counter 52. That is, the row address output circuit 50 outputs the row address stored in the counter 52 on the shared address path 40. The even bank control blocks 23 may then refresh the row address in the even memory banks 12, and the odd bank control blocks 24 may refresh the row address in the odd memory banks 13. Because the memory banks 11 are synchronized, the row address in the even memory banks 12 and the row address in the odd memory banks 13 are the same. The counter 52 may then increment the row address (e.g., to a next immediate row address). The method 240 then restarts and returns to process block 242.

If the row address output circuit 50 determines (decision block 244) that the first command is not the $REF_{ab}$ command 56, the row address output circuit 50 determines (decision block 248) whether the first command is a $REF_{sb}$ command for a first set of memory banks (e.g., even or odd). If not, the row address output circuit 50 determines (decision block 250) whether the first command is the activate (e.g., ACT) command. If so, the row address output circuit 50 selects (process block 252) a row address to be activated on the shared address path 40. The bank control blocks 22 may then activate the row address of the memory banks 11. The method 240 then restarts and returns to process block 242.

If the row address output circuit 50 determines (decision block 244) that the first command is the $REF_{sb}$ command for the first set of memory banks, the row address output circuit 50 stores (process block 254) the counter output of the counter 52 in a flip-flop 54. That is, the row address stored in the counter 52 is stored in the flip-flop 54. The row address output circuit 50 then selects (process block 256) the counter output and increments the counter 52. That is, the row address output circuit 50 outputs the row address stored in the counter 52 on the shared address path 40. The counter 52 may then increment the row address (e.g., to a next immediate row address).

The row address output circuit 50 receives (process block 258) a subsequent command. The row address output circuit 50 then determines (decision block 260) whether the subsequent command is the $REF_{sb}$ command for a second set of memory banks. In particular, if the first command was the $REF_{sb}$(Even) command 58 for the even memory banks 12, then the subsequent command is the $REF_{sb}$(Odd) command 60 for the odd memory banks 13. Similarly, if the first command was the $REF_{sb}$(Odd) command 60 for the odd memory banks 13, then the subsequent command is the $REF_{sb}$(Even) command 58 for the even memory banks 12. If so, the row address output circuit 50 selects (process block 262) the flip-flop output of the flip-flop 54. That is, the row address output circuit 50 outputs the row address stored in the flip-flop 54 on the shared address path 40. Refreshing the second set of memory banks may synchronize the memory banks 11. As such, the method 240 then restarts and returns to process block 242.

If the row address output circuit 50 determines (decision block 260) that the subsequent command is not $REF_{sb}$ for the second set of memory banks, then the subsequent command may not synchronize the memory banks 11. The row address output circuit 50 may then determine (decision block 264) whether the subsequent command is the $REF_{ab}$ command 56 or the $REF_{sb}$ command for the first set of memory banks. If so, the row address output circuit 50 selects (process block 266) the flip-flop output of the flip-flop 54. That is, the row address output circuit 50 outputs the row address stored in the flip-flop 54 on the shared address path 40. Because the $REF_{ab}$ command 56 and the $REF_{sb}$ command for the first set of memory banks do not synchronize the memory banks 11, the method 240 returns to process block 258 to receive another subsequent command. The method 240 may only restart when the row address output circuit 50 receives a subsequent command that synchronizes the memory banks 11 (e.g., the $REF_{sb}$ command for the second set of memory banks).

If the row address output circuit 50 does not determine (decision block 264) that the subsequent command is the $REF_{ab}$ command 56 or the $REF_{sb}$ command for the first set of memory banks, the row address output circuit 50 may determine (decision block 268) whether the subsequent command is the activate (e.g., ACT) command. If so, the row address output circuit 50 selects (process block 270) the row address to be activated on the shared address path 40. The bank control blocks 22 may then activate the row address of the memory banks 11. Because the ACT command does not synchronize the memory banks 11, the method 240 returns to process block 258 to receive another subsequent command. The method 240 may only restart when the row address output circuit 50 receives a subsequent command that synchronizes the memory banks 11 (e.g., the $REF_{sb}$ command for the second set of memory banks). In this manner, synchronization or pairing of the rows in the memory banks 11 being refreshed may be enforced or maintained.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A system comprising:
   a plurality of memory banks configured to store data, wherein the plurality of memory banks comprises a first set of memory banks and a second set of memory banks;
   an address path coupled to the plurality of memory banks, wherein the address path is configured to provide a row address to the plurality of memory banks; and
   a command address input circuit coupled to the address path, wherein the command address input circuit comprises:
      a counter configured to store and increment the row address; and
      a flip-flop configured to store the row address incremented by the counter in response to receiving a command to refresh the first set of memory banks, wherein the command address input circuit is configured to select the row address stored in the flip-flop and refresh a first row of the first set of memory banks associated with the row address stored in the flip-flop via the address path while activating a second row of the second set of memory banks via the address path.

2. The system of claim 1, wherein the command address input circuit is configured to select the row address stored in the counter and refresh a row of the plurality of memory banks associated with the row address stored in the counter via the address path when the plurality of memory banks is synchronized.

3. The system of claim 1, wherein the command address input circuit is configured to select the row address stored in the flip-flop and refresh a row of the plurality of memory banks associated with the row address stored in the flip-flop via the address path when the plurality of memory banks is unsynchronized.

4. The system of claim 3, wherein the plurality of memory banks remains unsynchronized after the command address input circuit refreshes the row of the plurality of memory banks associated with the row address stored in the flip-flop.

5. The system of claim 1, wherein the command address input circuit is configured to select the row address stored in the flip-flop and refresh a row of the first set of memory banks associated with the row address stored in the flip-flop via the address path when the plurality of memory banks is unsynchronized.

6. The system of claim 5, wherein the plurality of memory banks remains unsynchronized after the command address input circuit refreshes the row of the first set of memory banks associated with the row address stored in the flip-flop.

7. The system of claim 1, wherein the command address input circuit is configured to select the row address stored in the flip-flop and refresh a row of the second set of memory banks associated with the row address stored in the flip-flop via the address path when the plurality of memory banks is unsynchronized.

8. The system of claim 7, wherein the plurality of memory banks is synchronized after the command address input circuit refreshes the row of the second set of memory banks associated with the row address stored in the flip-flop.

9. The system of claim 1, wherein the flip-flop is configured to store the row address when the plurality of memory banks is synchronized.

10. The system of claim 1, comprising a plurality of bank control blocks coupled to the plurality of memory banks, wherein the plurality of bank control blocks are configured to internally increment the row address upon receiving the row address via the address path.

11. The system of claim 2, wherein the plurality of memory banks is synchronized when row addresses of the most recently refreshed row of each memory bank of the plurality of memory banks are the same.

12. The system of claim 1, comprising a multiplexer configured to output the row address from the counter or the row address from the flip-flop based on a selection signal.

13. The system of claim 12, wherein the multiplexer is configured to output the row address from the counter when the memory banks are synchronized and the selection signal is associated with refreshing the memory banks or the first set of the memory banks.

14. The system of claim 12, wherein the multiplexer is configured to output the row address from the flip-flop when the memory banks are unsynchronized and the selection signal is associated with refreshing the memory banks, the first set of the memory banks, or the second set of the memory banks.

15. The system of claim 12, wherein the multiplexer is configured to output an activate row address of the memory banks to be activated based on the selection signal.

16. The system of claim 15, wherein the multiplexer is configured to output the activate row address when the selection signal is associated with activating the memory banks.

* * * * *